United States Patent [19]

Koizumi

[11] Patent Number: 5,801,581

[45] Date of Patent: Sep. 1, 1998

[54] COMPARISON DETECTION CIRCUIT

[75] Inventor: Toru Koizumi, Yokohama, Japan

[73] Assignee: Canon Kabushiki Kaisha, Tokyo, Japan

[21] Appl. No.: 786,335

[22] Filed: Jan. 23, 1997

[30] Foreign Application Priority Data

Jan. 31, 1996 [JP] Japan ..................... 8-015674

[51] Int. Cl.$^6$ .................................. G05F 1/10
[52] U.S. Cl. ................ 327/538; 327/514; 327/530; 327/80
[58] Field of Search .................. 327/514, 530, 327/538, 543, 53, 58, 60, 61, 62, 77, 80, 81; 323/312, 315

[56] References Cited

FOREIGN PATENT DOCUMENTS 0 288 574 A1   11/1988   European Pat. Off. .
0 661 616 A2   7/1995    European Pat. Off. .

*Primary Examiner*—Timothy P. Callahan
*Assistant Examiner*—Jeffrey Zweizig
*Attorney, Agent, or Firm*—Fitzpatrick, Cella, Harper & Scinto

[57] ABSTRACT

A detection circuit includes a current mirror circuit that produces electric currents at first and second output terminals in response to a current supplied to its input terminal. A first active load is connected to the first output terminal and a second active load is connected to the second output terminal and an external output terminal. A control circuit controls the potential of the control electrode of the second active load according to the voltage or the current at the first output terminal. The control circuit can include a capacitive device that determines the voltage at the control electrodes of the active loads according to the peak value of current supplied to the current mirror circuit input terminal.

31 Claims, 10 Drawing Sheets

COMPARISON DETECTION CIRCUIT

BACKGROUND OF THE INVENTION

1. Field of the Invention

The present invention relates to a detection circuit and, more particularly, to a detection circuit suitable for use in circuits which convert external signals, such as light signals or magnetic signals into electrical signals and which output a signal with a predetermined threshold value level (slice level) as a reference.

2. Related Background Art

Detection circuits are used for horizontal synchronizing apparatuses on which light signals are scanned, such as laser beam printers (LBPs) or compact disc (CD) players.

FIG. 9 is a circuit diagram illustrating a case in which a detection circuit is used as a horizontal scanning detection circuit of a laser beam of a laser beam printer. Referring to FIG. 9, when light enters a photodiode D serving as a photosensor, electric current corresponding to the amount of incident light flows, and the base electrical potential of an NPN bipolar transistor (hereinafter referred to as a "bipolar transistor") T4 whose base is connected to the photodiode D increases. As a result, an electric current flows through the NPN bipolar transistor T4 and an electric current is made to flow through a resistor R1 which is a load of the transistor T4. Then, the base electrical potentials of bipolar transistors T1 and T2 whose bases are connected in common to the emitter of the bipolar transistor T4 increase. Here, the size ratio of the bipolar transistor T1 to the bipolar transistor T2 is set at 1:L (for example, L=10). This size ratio can be easily obtained by setting the ratio of the base/emitter junction area at 1:L. In this way, when the photocurrent which flows through the bipolar transistor T1 is assumed to be 1, electric current which is L times as great as the photocurrent flows through the bipolar transistor T2 via a resistor R2. Then, the electrical potential of an output end b decreases. The signal is inverted by output buffer B, and a high-level signal is output.

FIG. 10 is a characteristic view illustrating the relationship between a light signal and an IC output. When a light signal exceeding a certain slice level is input at a time t1, the IC output changes from a low L level to a high H level near time t2. In the above-described circuit, the slice level is defined by the amount of incident light on the photodiode, the resistance value of the resistor R2 and the size ratio of the bipolar transistors T1 and T2. In similar manner, when the light signal falls below the slice level at time t3, the IC output is inverted near time t4.

The above-described slice level must be kept within a certain range with respect to a maximum light amount by an optical system including a light source (for example, 20 to 50% of the maximum light amount) in order to maintain performance.

However, in the comparison detection circuit shown in FIG. 9, the photocurrent of the photodiode D is received by the bipolar transistors T1 and T2, and the output is loaded by the resistor R2 which is a passive element. For this reason, the slice level is determined by the relative light amount to the photodiode D rather than a relative value of the percentage of the peak light amount entering the photodiode D.

Therefore, in cases where a comparison detection circuit as shown in FIG. 9 is used in several types of laser beam printers (LBPs) whose beam level is different for each type, it is required that the resistor R2 be an external resistor provided separately from an IC chip having bipolar transistors T1, T2 and T4 and that the slice level be adjusted by the external resistor.

However, in a circuit type in which a slice level is adjusted by an external resistor, a load resistor is connected from the output terminal of the IC to the outside. Accordingly, a parasitic capacitance of several pF to tens of pF occurs and the time constant defined by the RC time constant increases, causing the delay time to increase. In particular, when the slice level is set to a low light level, the external resistance value must be increased. In such a case, the delay time reaches several μsec.

There is also a problem in that jitter characteristics are increased to a greater extent in correlation with the above problems. A fluctuation of the delay time is jitter as shown in FIG. 10. A large amount of jitter means that detection positions vary. This leads to a horizontal variation of characters in the case of an LBP. In printers, as the resolution becomes higher, there is a demand for a higher scanning speed. Therefore, in connection with the demand, a satisfactory jitter characteristic is required.

In the same type of LBP in which the laser beam light level is set the same, if the level of light input to the sensor is decreased greatly due to aging of the optical system, for example, due to changes in the output of the laser beam or the reflectance of the reflection mirror, it becomes necessary to adjust the slice level. Further, in order to make slice levels uniform, accuracy in photosensitivity is required. However, the photosensitivity of the total IC varies due to variations in packages and the sensitivity of photodiodes. Therefore, when accuracy in photosensitivity is required, this requirement becomes a factor for causing a substantial decrease in yield.

SUMMARY OF THE INVENTION

An object of the present invention is to provide a versatile detection circuit.

Another object of the present invention is to provide a detection circuit capable of determining a slice level to be relative to the output peak value of the signal source as a reference.

According to the present invention, there is provided a detection circuit, including: a current mirror circuit having an input terminal connected to signal supply, and first and second output terminals through which electric currents corresponding to an electric current supplied to the input terminal flow; a first active load connected to the first output terminal; a second active load connected to the second output terminal and to an external output terminal and having a control electrode; and a control circuit for controlling an electrical potential of the control electrode of the second active load on the basis of the voltage value or the current value at the first output terminal.

The above and further objects, aspects and novel features of the invention will become more apparent from the following detailed description when read in connection with the accompanying drawings.

DETAILED DESCRIPTION OF THE PREFERRED EMBODIMENTS

Figure 1:
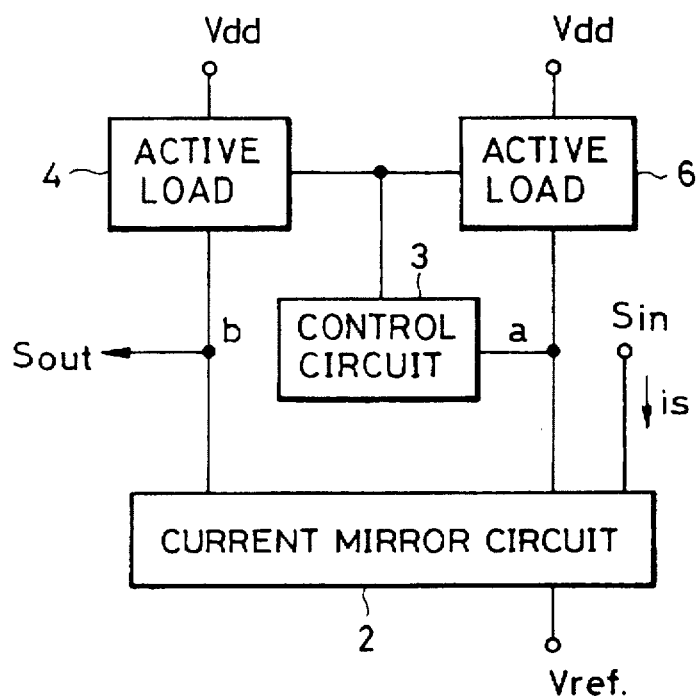
FIG. 1 schematically shows a detection circuit according to the present invention.

FIG. 1 is a block diagram schematically illustrating an arrangement of a detection circuit of the present invention. A detailed circuit arrangement will be described later with reference to FIG. 2 and those that follow.

Shown in FIG. 1 are input terminal Sin of a current mirror circuit 2, which input terminal is connected to signal supply (not shown), and output terminals a and b of the current mirror circuit 2.

Also shown in FIG. 1 are a first load 6 in which an active element is used, which first load 6 is connected to the output terminal a of the current mirror circuit 2, a second load 4 in which an active element is used, which second load 4 is connected to the output terminal b of the current mirror circuit 2, with the output terminal b serving as an output terminal for outputting signals $S_{out}$ to an external source outside this detection circuit.

Further shown in FIG. 1 are a control circuit 3 for controlling the electrical potential of a control electrode of the active load 4. More specifically, the control circuit 3 controls electric current which flows through the second active load 4 on the basis of the voltage value or the current value of the output terminal a.

Here, the ratio of the current supply capabilities of the two active loads 4 and 6, or the ratio of the current supply capabilities of the two output terminals of the current mirror circuit 2, is set at an appropriate ratio beforehand.

When an input signal current $i_s$ is supplied to the input terminal Sin from signal supply, electric current which is N times as great as $i_s$ flows through the output terminals a and b respectively in response to the electric current $i_s$. N is a ratio determined by the current supply capabilities of the transistors making up the current mirror circuit 2.

The control circuit 3 is connected to the output terminal a. The control circuit 3 controls the electrical potential of the control electrode (gate or base) of the active load so that when the electrical potential of the output terminal a reaches a predetermined electrical potential, electric current flows through the active loads 4 and 6.

At this time, if the current supply capabilities of these two active loads 4 and 6 are set at 1:M, electric current of $i_s.N/M$ is made to flow through terminal b, and electric current of $i_s.N$ is made to flow through terminal a. In this way, in the terminal b, the output is switched with 1/M of the peak value of current is as a threshold value.

Here, the signal supply needs only to be capable of supplying electric current and is not limited to a unit for converting an external signal to electric current. In addition, the unit for converting an external signal to electric current is not limited to a unit for converting an external signal to electric current and may be a unit for converting a magnetic signal or the like to a current signal.

To be specific, the signal supply is a photosensor or a magnetic sensor, and a typical example of the former is a photodiode. Also, the signal supply is preferably integrated on the same IC chip as the detection circuit of the present invention. The current mirror circuit used in the present invention may be formed of a field-effect transistor or a bipolar transistor.

As active loads used in the present invention, one or more field-effect transistors or one or more bipolar transistors are used. When an MOS (metal-oxide-semiconductor) transistor is used as an active load, the operating range is compressed to the square root of Ip; and when a bipolar transistor is used, this range is compressed to the logarithm of In (Ip), and a wide dynamic range can be obtained.

The current supply capability of the current mirror current can be determined by the area of the base-emitter junction, and that of the MOS transistor can be determined by the gate width thereof.

In a case in which a bipolar transistor having a multi-emitter is used as an active load, the current supply capability can be determined by the sum of the areas of the base-emitter junction.

Further, when a plurality of transistors are used in each of the active loads 4 and 6, the plurality of transistors are connected in parallel so that the sources (emitters) and drains (collectors) serving as main electrodes are connected in common and the control electrode (the gate or base) are also connected in common.

(First Embodiment)

Figure 2:
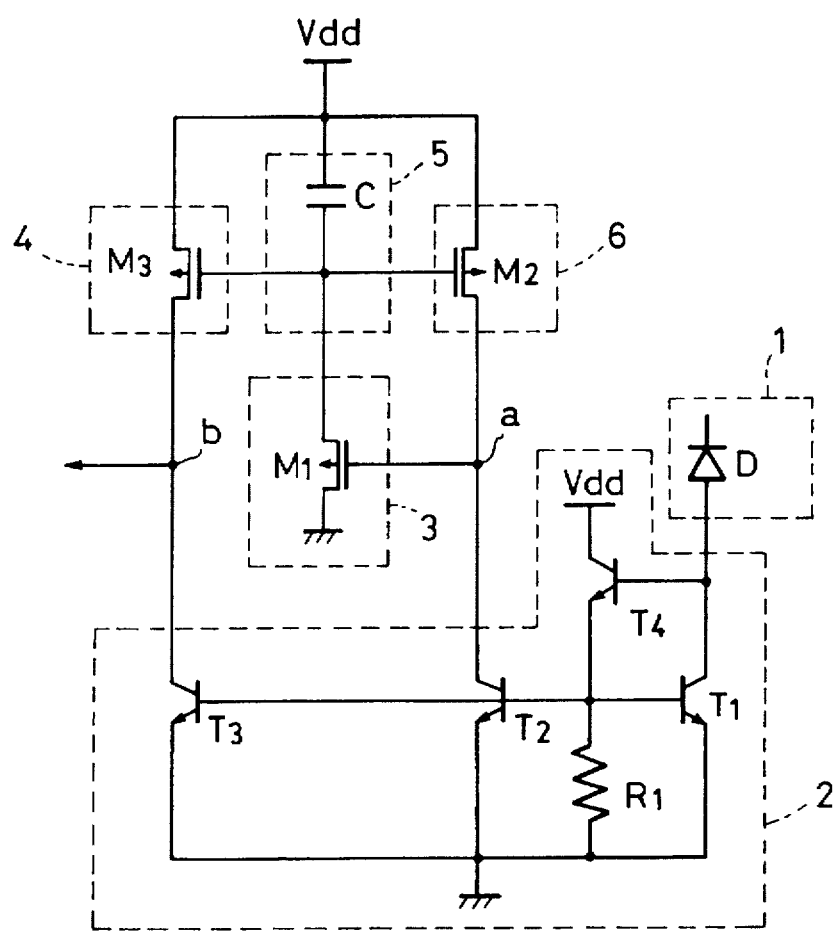
FIG. 2 is a circuit diagram illustrating a first embodiment of the present invention.

FIG. 2 is a circuit diagram illustrating a first embodiment of the present invention. Shown in FIG. 2 are signal supply unit 1, for example, a photodiode D, for supplying a current signal, a current mirror circuit 2 which is connected to the photodiode D and has output terminals a and b, a switch unit 3, for example, a PMOS (P-channel MOS) transistor M1, which is controlled on the basis of a voltage value or a current value of the first output terminal a, an active load 4, for example, a PMOS transistor M3, connected to the second output terminal b, a capacitance unit 5, for example, a capacitor C, for holding the peak value of the voltage value or the current value, and an active load 6, for example, a PMOS transistor M2, which is connected to the first output terminal a. The capacitance unit 5 need not be a capacitive element if the capacitance value due to the parasitic wiring capacity and the parasitic gate capacitance is a sufficient value.

The current mirror circuit 2 is made up of bipolar transistors T1 to T3 whose bases are connected in common, a bipolar transistor T4 whose emitter is connected to the bases connected in common, and a resistor R1 having one terminal connected to the bases connected in common. The collector of the bipolar transistor T4 is connected to a power source (Vdd) serving as a reference voltage source, and the base thereof is connected to the anode side of the photodiode D and the collector of the bipolar transistor T1. Normally, a reverse bias voltage is applied to the photodiode having a PN junction.

The size ratio of the bipolar transistor T1 to the bipolar transistors T2 and T3 is set at 1:N (N>1), and the size ratio of the bipolar transistor T2 to the bipolar transistor T3 is set at 10:M (M<10).

The peak hold operation in the above-described circuit will now be described.

It is assumed that the electrical potential of the gate electrodes of the PMOS transistors M2 and M3 is very close to the power voltage Vdd and the PMOS transistors M2 and M3 are in an off state in which electric current hardly flows. Since electric current does not flow through the current mirror circuit 2 in a state in which photocurrent is not input, the electrical potential of the first output terminal a and the second output terminal b in a floating state is close to Vdd.

At this point, when light enters the photodiode D, electric current corresponding to the level of incident light flows and the base electrical potential of the bipolar transistor T4 whose base is connected to the photodiode D increases, causing electric current to flow through the NPN bipolar transistor T4. Thereupon, the base electrical potential of the bipolar transistors T1 to T3 whose bases are connected in common to the emitter of the bipolar transistor T4 also increases. Since the size ratio of the bipolar transistor T1 to the bipolar transistors T2 and T3 is 1:N as described above, photocurrent flows through the bipolar transistor T1 and electric current which is N times as great as the photocurrent flows through the bipolar transistors T2 and T3.

However, since the PMOS transistor M2 is in an off state, no electric current flows via the PMOS transistor M2. When the electrical potential of the first output terminal a decreases from the Vdd level and reaches close to the ground electrical potential as a reference voltage, the switch unit formed of the PMOS transistor M1 is turned on. Then, the gate electrical potential of the PMOS transistor M2 decreases and reaches close to the ground electrical potential as a reference voltage, and the PMOS transistor M2 is turned on, allowing electric current to flow.

Here, if the gate-source electrical potential difference of the PMOS transistor M2 is denoted as Vgs2, the amount of electric current ($I_{Dpm2}$) which the PMOS transistor M2 allows to flow is given as follows:

$$I_{Dpm2} = \beta2 \, (Vgs2-Vth)^2$$

wherein β2 is transconductance.

If the photocurrent is denoted as Ip, the first output terminal a reaches a low level if $\beta2 \, (Vgs2-Vth)^2 < N \cdot Ip$ (Condition (1)), and the first output terminal a reaches a high level if $\beta2 \, (Vgs2-Vth)^2 > N \cdot Ip$ (Condition (2)). Since the PMOS transistor M2 is an active load, the first output terminal a reaches a high level at the moment Condition (2) is satisfied, causing the switch unit formed of the PMOS transistor M1 to be closed.

As a result, a voltage which satisfies the relation described below is applied to the gate electrode (or the gate electrode and the capacitor C1) of the PMOS transistor M2:

$$I_{Dpm2} = \beta2 \, (Vgs2-Vth)^2 = N \cdot Ip$$

thereby achieving a peak hold.

The setting and output of the slice level will now be described below.

Since the size ratio of the PMOS transistor M2 to the PMOS transistor M3 is 10:M (M<10), the signal supply capability of the PMOS transistor M3 becomes M/10 (M<10) of the PMOS transistor M2. When a consideration is made by applying the above-described equation of condition (1) to the PMOS transistor M3, since the current supply capability is M/10, the second output terminal b outputs a low-level signal at M/10 of the peak current value. In other words, the second output terminal b outputs a low-level signal at a level of light which is M/10 of the peak light level.

As described above, in the present invention, use of an active load makes it possible to achieve a peak hold easily and at high speed and to obtain a sharp output from the second output terminal.

Also, since, in the present invention there is provided a peak hold function and a slice level is determined with this peak value as a reference, there is no need to consider problems relating to sensitivity variations and changes in light level. Further, even when the slice level is set to a low light level, since there is not such a large parasitic capacitance as that of the known art, the delay time does not reach several μ sec.

(Second Embodiment)

Figure 3:
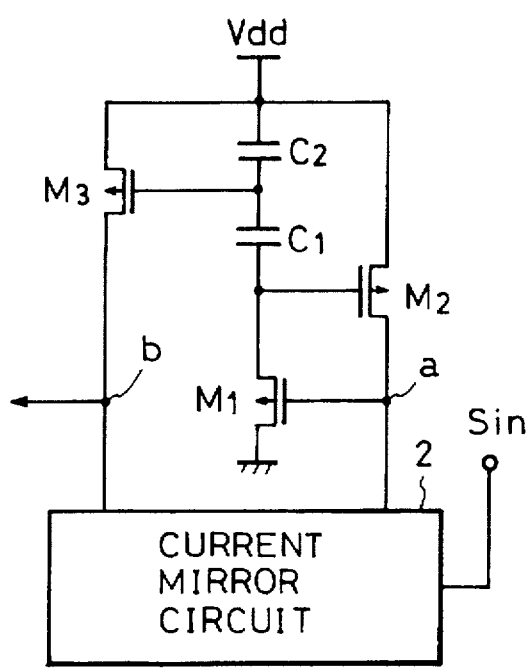
FIG. 3 is a partial circuit diagram illustrating a second embodiment of the present invention.

FIG. 3 shows a comparison detection circuit according to a second embodiment of the present invention.

The portion of the current mirror circuit 2 is arranged by using the same circuit as that shown in, for example, FIG. 2. The different points of this embodiment from those of the first embodiment are that the capacitive unit 5 is formed by connecting the capacitors C1 and C2 in series, the connection point between the capacitors C1 and C2 is connected to the PMOS transistor M3 which acts as an active load, and the other terminal of the capacitor C1 is connected to the PMOS transistor M1 and the PMOS transistor M2 which act as active loads. In the circuit of the arrangement of FIG. 2, the size ratio of the PMOS transistor M2 to the PMOS transistor M3 may be 1:1. Since the voltage applied to the PMOS transistor M2 and Vdd are capacitively divided and applied to the gate of the PMOS transistor M3, the current supply capability of the PMOS transistor M3 becomes smaller than that of the PMOS transistor M2, and the second output terminal b outputs a low-level signal at a level of light (its value is defined by the capacitance ratio of the capacitor C1 to the capacitor C2) smaller than the peak level of light.

Figure 10:
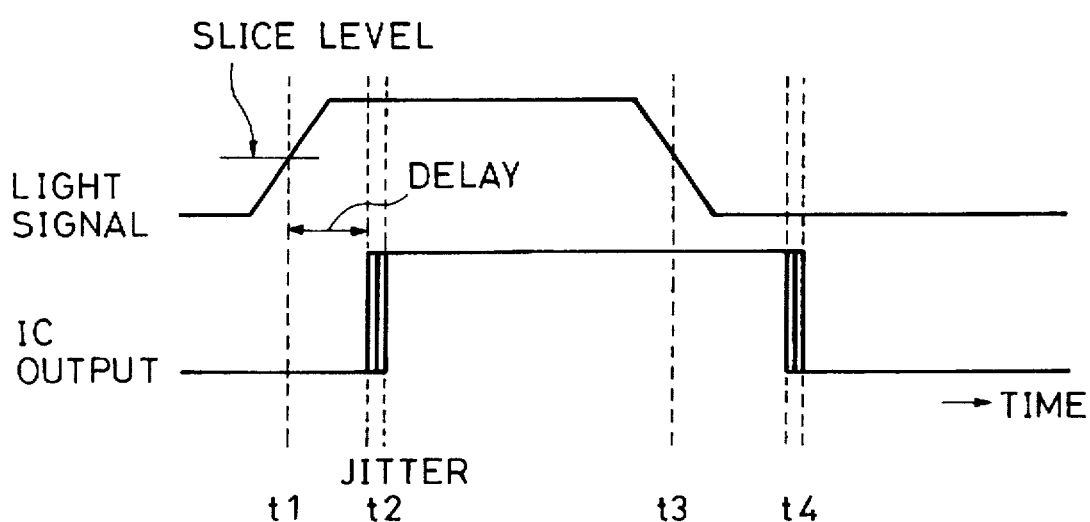
FIG. 10 is a characteristic view illustrating the relationship between a light signal and an IC output.

Further, in the present invention, jitter, which is a fluctuation of a delay time shown in FIG. 10, can be reduced. The inventors of the present invention diligently made an analysis in order to reduce jitter and found that the major factors causing jitter are the following:

(1) Fluctuation of a light source (2) Shot noise of ICs, including a current mirror circuit (3) The slice level of an output buffer fluctuation due to power-supply noise In the present invention, since a slice level is set inside the IC, parasitic capacitance is greatly reduced, enabling jitter resulting from the above-described items (1) and (3) to be greatly decreased.

Jitter resulting from the above-described item (1) is the following. The delay time τ depends upon a light level Ip, and the delay time T increases with a decrease in the light level. Therefore, if a light level varies by ΔIp, the delay time Δτ also varies, that is, jitter occurs. The magnitude of jitter can be expressed as follows:

$$\Delta\tau = (\partial\tau/\partial Ip) \times \Delta Ip$$

At this time, if τ is small, naturally Δτ becomes small. In the present invention, since the slice level is set inside the IC, there is not a large parasitic capacitance and the delay time τ decreases. In correlation with this, jitter Δτ is also reduced.

Figure 4:
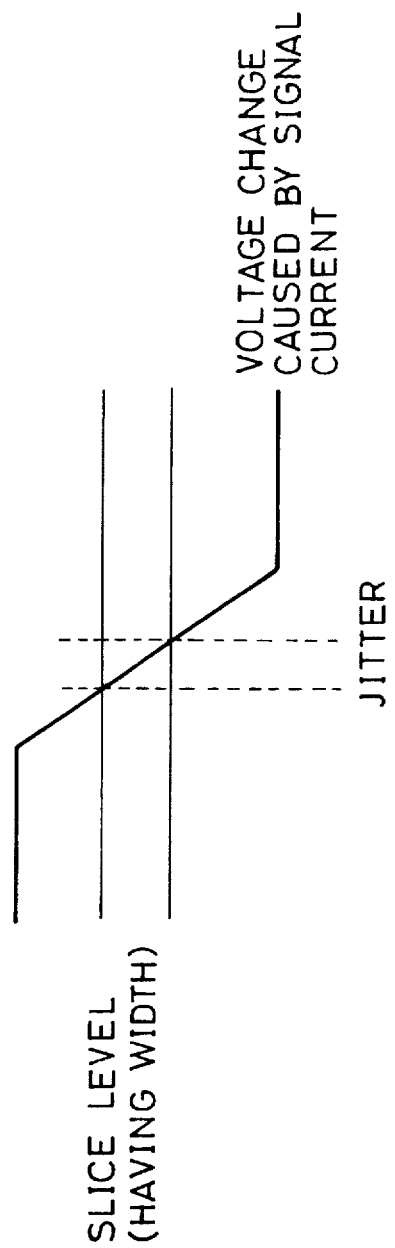
FIG. 4 shows a reduction of jitter according to the second embodiment of the present invention.

Next, reduction of jitter resulting from the above-described item (3) will be described with reference to FIG. 4.

In practice, when ICs are manufactured, an output buffer is provided. When signals are sent out to this output buffer, jitter occurs. If ICs relating to the present invention are interpreted broadly, signal current (photocurrent Ip) is converted into voltage by a load, and this voltage change is transmitted to the output buffer. When this voltage change exceeds a certain value (slice level), the output buffer outputs a signal. When a power-supply voltage varies, the slice level varies, that is, the slice level has a certain width ΔV. On the other hand, a voltage change caused by the signal current requires time. When the time differential of this voltage change is denoted as g, the jitter can be expressed by ΔV/g. If this g is large, jitter becomes small. In the present invention, the delay time τ becomes small. That is, g becomes large, and jitter becomes small.

(Third Embodiment)

Figure 5:
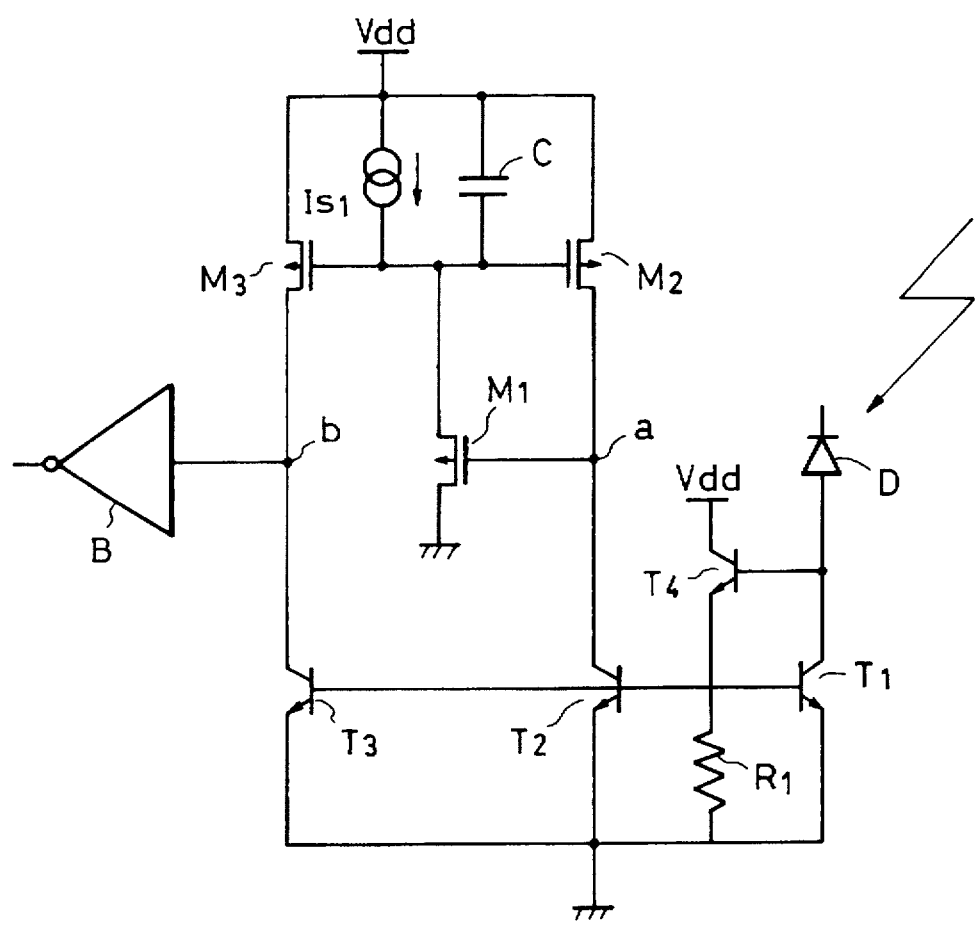
FIG. 5 is a circuit diagram illustrating a comparison detection circuit according to a third or a fourth embodiment of the present invention.

FIG. 5 is a circuit diagram illustrating a comparison detection circuit according to a third embodiment of the present invention. The comparison detection circuit of FIG. 5 is manufactured as a one-chip, monolithic IC on a silicon semiconductor substrate.

In this embodiment, in addition to the peak holding capacitor C, a very small current source Is1 of approximately tens of pA is connected to the gate terminal of the PMOS transistor M2.

A situation is assumed in which a sufficient time has elapsed after the power is switched on. The electrical potential of the gate electrode of the PMOS transistor M2 reaches very close to the power-supply voltage Vdd due to the very small current source Is1. This is a reset state. The reset method is not limited to a method using a very small current source, and may be set to a reset electrical potential via a reset switch in accordance with an external or internal reset signal.

In this embodiment, the size ratio of the bipolar transistor T1 for input of the current mirror circuit to the bipolar transistors T2 and T3 for output is 1:5. As a result, photocurrent generated in the photodiode D flows through the bipolar transistor T1, and electric current which is five times as great as this photocurrent flows through the bipolar transistors T2 and T3. When, for example, photocurrent is 10 μA, electric current of 50 μA can flow through the bipolar transistors T2 and T3.

Further, in this embodiment, the size ratio of the PMOS transistor M2 to the PMOS transistor M3 is set at 10:3. Therefore, the current supply capability of the PMOS transistor M3 becomes 3/10 of that of the PMOS transistor M2. Therefore, in this embodiment, the second output terminal b outputs a low-level signal at an L level of 3/10=30% of the peak. Then, this output is output via a buffer amplifier B. In this embodiment, the slice level can be made to be 30% of the peak light level.

(Fourth Embodiment)

In this embodiment, the slice level is changed by changing the size ratio of the bipolar transistor T2 to the bipolar transistor T3 without changing the size ratio of the PMOS transistor M2 to the PMOS transistor M3.

More specifically, in FIG. 5, the size ratio of the PMOS transistor M2 to the PMOS transistor M3 is set at 1:1, and the size ratio of the bipolar transistor T2 to the bipolar transistor T3 is set at 10:3. In this embodiment also, the slice level can be made to be 30% of the peak light level in the same way as in the first embodiment.

(Fifth Embodiment)

Figure 6:
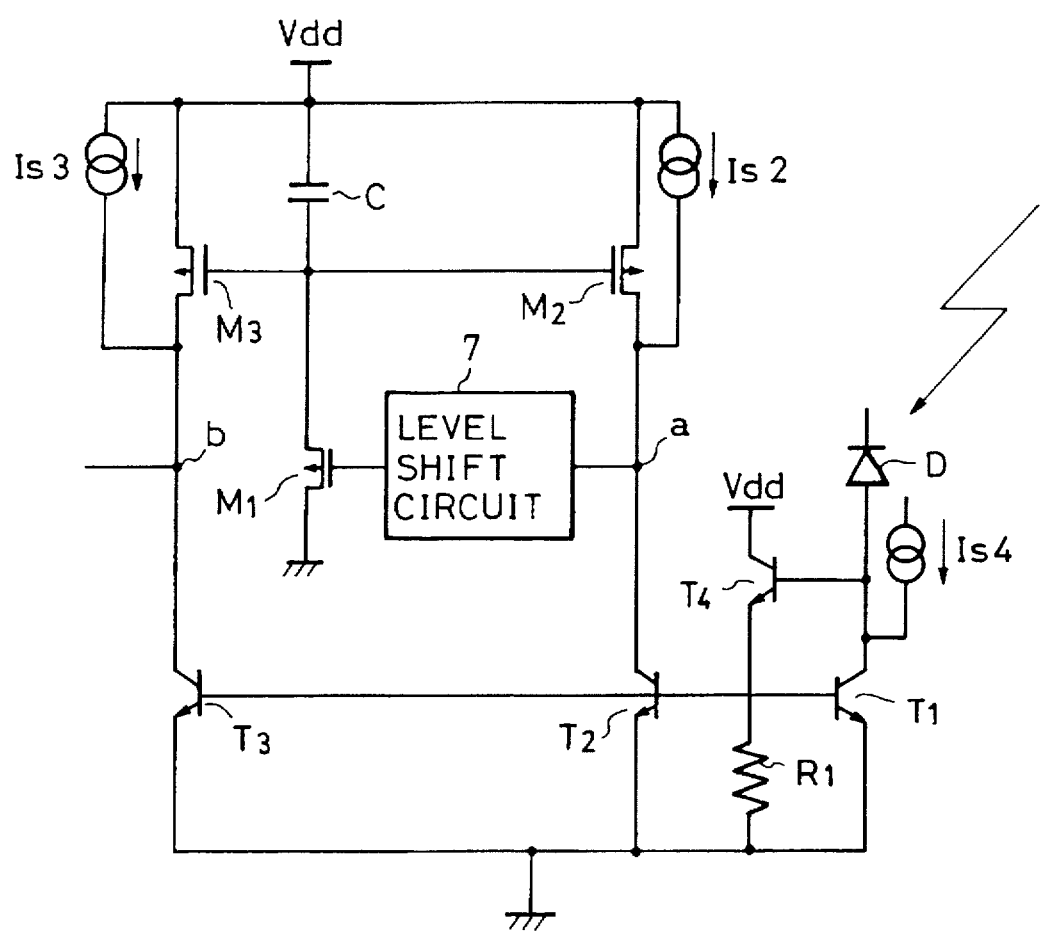
FIG. 6 is a circuit diagram illustrating a comparison detection circuit according to a fifth embodiment of the present invention.

FIG. 6 is a circuit diagram illustrating a comparison detection circuit according to a fifth embodiment of the present invention.

In this embodiment, as shown in FIG. 6, an idling current source Is2 is connected to the first output terminal a side of the PMOS transistor M2, an idling current source Is3 is connected to the second output terminal b side of the PMOS transistor M3, and an idling current source Is4 is connected to the collector side of the bipolar transistor T1. Further, a level shift circuit 7 is provided between the PMOS transistor M1 and the first output terminal a.

This embodiment aims to improve the peak writing accuracy and the rise-time characteristics of the current mirror circuit.

Generally speaking, even if a signal is fed to the base of a bipolar transistor, collector current does not flow immediately and a fixed delay occurs. Therefore, also in the current mirror circuit formed of a bipolar transistor, a delay occurs from when a current signal is input until the current mirror circuit begins current mirror operation. In this embodiment, in order to improve rise-time characteristics of the current mirror circuit, electric current is made to flow from the idling current source Is4, causing base current to flow, and electric current is made to flow from the idling current sources Is2 and Is3 to the output terminal of the current mirror circuit. Since the size ratio of the bipolar transistor T1 to the bipolar transistors T2 and T3 is set at 1:5, electric current which is five times as great as the current value from the idling current source Is4 is supplied from the idling current sources Is2 and Is3.

Further, in this embodiment, by providing the level shift circuit 7 between the first output terminal a and the gate electrode of the PMOS transistor M1, the gate electrical potential of the PMOS transistor M1 is increased to higher than the electrical potential of the output terminal a, and the peak writing accuracy is increased.

The reasons for the above are as follows:

The peak writing accuracy requires that there is no delay between the electrical potential of the first output terminal a and the opening/closing of the switch. In a case in which there is no level shift, in order for the PMOS transistor M2 to cause electric current to flow, the electrical potential of the first output terminal a must be decreased by an amount of 2Vth of the threshold voltage Vth of the PMOS transistor M2 and the threshold voltage Vth of the PMOS transistor M1 in order to achieve effective writing. Therefore, 2Vth is a wasteful voltage drop, and this amount leads to a delay in the opening/closing of the switch. When a delay occurs in the closing of the switch, writeover occurs. If a shift by an amount of 2Vth is made previously by the level shift circuit, there occurs no wasteful voltage drop, and writeover does not occur.

(Sixth Embodiment)

Figure 7:
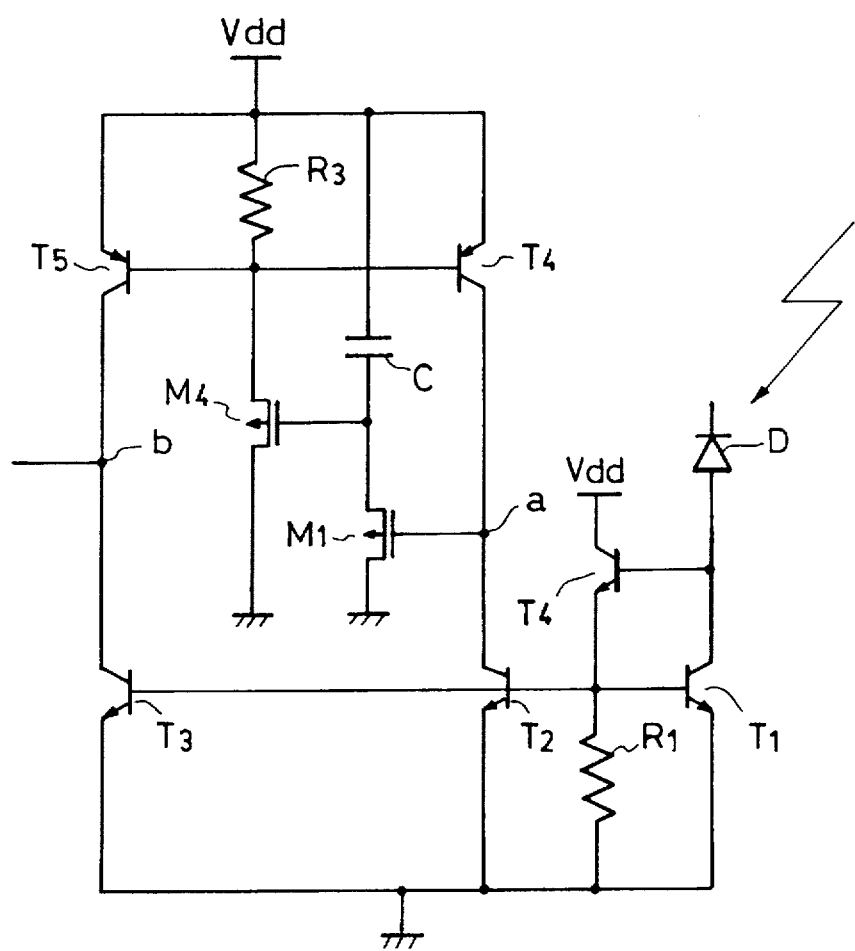
FIG. 7 is a circuit diagram illustrating a comparison detection circuit according to a sixth embodiment of the present invention.

FIG. 7 is a circuit diagram illustrating a comparison detection circuit according to a sixth embodiment of the present invention.

In this embodiment, as shown in FIG. 7, PMOS transistors are not used as active loads, but PNP bipolar transistors T4 and T5 are used. The base of the PNP bipolar transistor T4 and the base of the PNP bipolar transistor T5 are connected in common, and the two bases are grounded via the PMOS transistor M4 and connected to Vdd having a relatively large resistance value via a resistor R3. The gate of the PMOS transistor M4 is connected to the capacitor C and the PMOS transistor M1. In this embodiment, the size ratio of the bipolar transistor T1 to the bipolar transistors T2 and T3 is set at 1:5, and the size ratio of the PNP bipolar transistor T4 to the PNP bipolar transistor T5 is set at 10:3. Therefore, the current supply capability of the PNP bipolar transistor T5 becomes 3/10 of that of the PNP bipolar transistor T4.

The amount of electric current ($I_{DpmA}$) which the PNP bipolar transistor T4 allows to flow is given by the following equation:

$I_{DpmA} = Ies \cdot exp\ (q \cdot Vbe/kT)$ where Ies is emitter saturation current.

If the photocurrent is denoted as Ip, the first output terminal a reaches a low level if Ies·exp (q·Vbe/kT)<5Ip (Condition (1)), and the first output terminal a reaches a high level if Ies·exp (q·Vbe/kT)>5Ip (Condition (2)).

Since the PNP bipolar transistor T4 is an active load, the first output terminal a immediately reaches a high level at the moment Condition (2) is satisfied, causing the PMOS transistor M1 to be turned off.

As a result, a voltage which satisfies the relation described below is applied to the gate electrode of the PMOS transistor M4 and the capacitor C:

$I_{DpmA} = Ies \cdot exp\ (q \cdot Vbe/kT) = 5Ip$ achieving a peak hold.

In this embodiment, as described above, the current supply capability of the bipolar transistor T5 is 3/10 of that of the PNP bipolar transistor T4. The second output terminal b outputs a low-level signal at a light level of 3/10=30% of the peak, and the slice level can also be made to be 30% of the peak light level in this embodiment.

Figure 8:
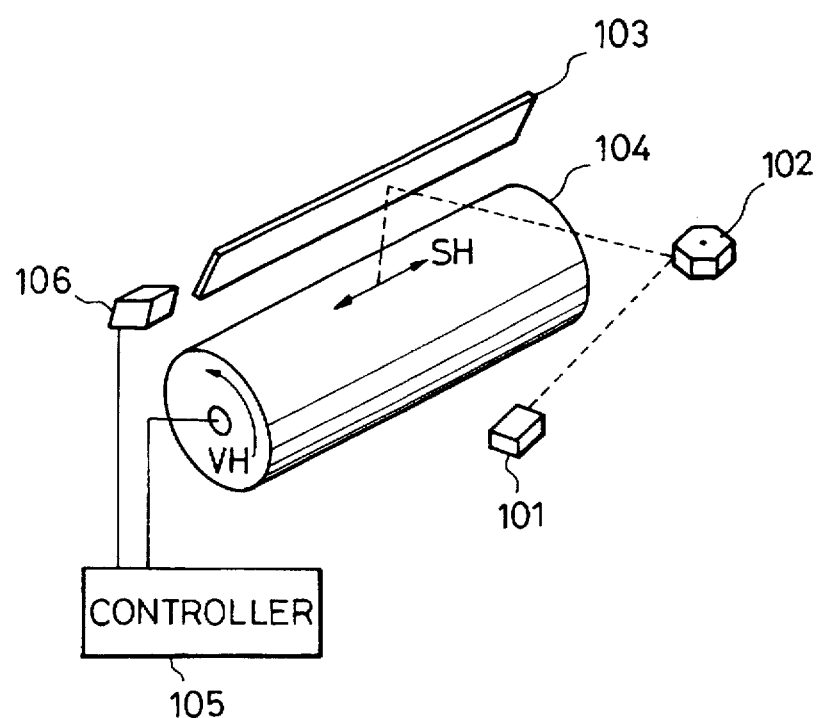
FIG. 8 is a schematic view of a laser beam printer having a comparison detection circuit according to the present invention.
Figure 9:
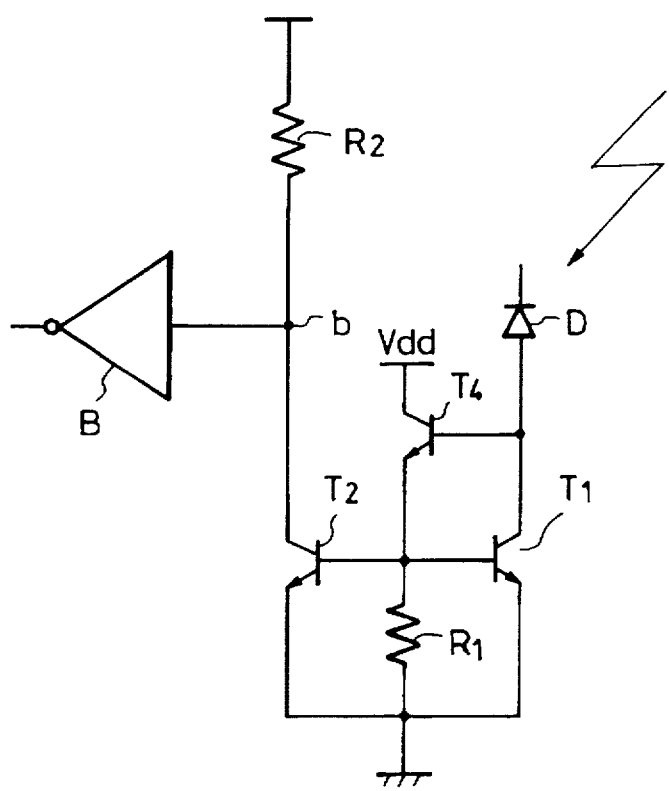
FIG. 9 is a circuit diagram illustrating a case in which a conventional detection circuit is used as a horizontal scanning detection circuit of a laser beam of an LBP.

FIG. 8 is a schematic view illustrating a laser beam printer (an electrophotographic apparatus using laser light as exposure light) employing a detection circuit according to the present invention.

Shown in FIG. 8 are a laser light source 101 having a particle laser which emits laser light, a polygon mirror 102, and a mirror 103, which form an exposure optical system, and a photosensitive member 104 and a controller 105.

The detection circuit of the present invention, together with a photo-receiving element, is provided in a horizontal scanning detection circuit 106 in order to synchronize the horizontal scanning timing of one line with the rotation timing of the photosensitive member.

Laser light emitted from the laser light source 101 is caused to horizontally scan by the polygon mirror 102 and irradiated onto the surface of the photosensitive member 104 via the mirror 103.

Laser light is detected for each horizontal scan by the horizontal scanning detection circuit 106, and the timing at which the laser light is received is fed back to the controller 105. As a result, the horizontal scanning timing along the SH direction is synchronized with the scanning timing along the direction of rotation VH of the photosensitive member. The illustration of a development unit, a charger, and transport means of the recording media is omitted in FIG. 8.

As has been described up to this point, according to the present invention, use of active loads makes it possible to achieve a peak hold easily and at a high speed, and a sharp output can be obtained from the output terminal. Further, in the present invention, a peak hold function is provided, and the slice level is determined by this peak value. Therefore, there is no need to consider problems relating to sensitivity variations and changes in the light level. Further, even when the slice level is set to a low level, the delay time does not reach several μsec.

Many different embodiments of the present invention may be constructed without departing from the spirit and scope of the present invention. It should be understood that the present invention is not limited to the specific embodiments described in this specification. To the contrary, the present invention is intended to cover various modifications and equivalent arrangements included within the spirit and scope of the invention as hereafter claimed. The scope of the following claims is to be accorded the broadest interpretation so as to encompass all such modifications, equivalent structures and functions.

What is claimed is:

1. A detection circuit, comprising:
   a current mirror circuit having an input terminal connected to signal supply means, and first and second output terminals through which electric currents corresponding to an electric current supplied to the input terminal flow;
   a first active load connected to the first output terminal and having a control electrode;
   a second active load connected to the second output terminal and to an external output terminal and having a control electrode; and
   a control circuit for controlling an electrical potential of the control electrode of the second active load on the basis of a voltage value or the current value at the first output terminal.

2. A detection circuit according to claim 1, wherein the control electrodes of the first and second active loads are connected together.

3. A detection circuit according to claim 1, wherein said control circuit includes a transistor having a control terminal connected to the first output terminal.

4. A detection circuit according to claim 1, wherein said control circuit includes means for setting the control electrode of the second active load either in a high-impedance state or in a state held at a predetermined electrical potential.

5. A detection circuit according to claim 4, wherein said setting means includes a resistive element and a transistor.

6. A detection circuit according to claim 4, wherein said setting means includes a capacitive element and a transistor.

7. A detection circuit according to claim 4, wherein said setting means includes a capacitive element, a resistive element and a transistor.

8. A detection circuit according to claim 1, wherein said control circuit includes a capacitive element.

9. A detection circuit according to claim 1, wherein said control circuit includes a level shift circuit for shifting the electrical potential of the first output terminal.

10. A detection circuit according to claim 1, wherein the current mirror circuit further comprises a transistor for controlling an electrical potential of commonly connected control electrodes of a transistor connected to the input terminal, a transistor connected to the first output terminal and a transistor connected to the second output terminal.

11. A detection circuit according to claim 1, wherein said the control electrodes of said first and second active loads are capacitively coupled to each other.

12. A detection circuit according to claim 1, wherein a current source is connected to the control electrodes of said first and second active loads.

13. A detection circuit according to claim 1, wherein a current source for causing idling current to flow is connected to said current mirror circuit.

14. A detection circuit according to claim 13, wherein said current source causes electric current to flow from a power source to said first and second output terminals.

15. A detection circuit according to claim 1, wherein said control circuit includes a transistor connected to the control electrodes of the first and second active loads and a capacitive element connected to a control electrode of the transistor.

16. A detection circuit according to claim 1, wherein said control circuit includes a transistor having main electrodes and a control electrode connected to the first input terminal, one of the main electrodes being connected to a reference voltage source.

17. A detection circuit according to claim 1, wherein a buffer amplifier is connected to said external output terminal.

18. A detection circuit according to claim 1, wherein said current mirror circuit is formed by bipolar transistors.

19. A detection circuit according to claim 1, wherein said current mirror circuit is formed by field-effect transistors.

20. A detection circuit according to claim 1, wherein each of said first and second active loads is a field-effect transistor.

21. A detection circuit according to claim 1, wherein each of said first and second active loads is a bipolar transistor.

22. A detection circuit according to claim 1, wherein each of said first and second active loads is a field-effect transistor, and said current mirror circuit is formed by bipolar transistors.

23. A detection circuit according to claim 1, wherein a current supply capability of said first active load differs from that of said second active load.

24. A detection circuit according to claim 1, wherein the current supply capability of a transistor connected to the first output terminal of said current mirror circuit differs from that of a transistor connected to the second output terminal of said current mirror circuit.

25. A detection circuit according to claim 1, wherein the electric current which flows through said first output terminal is larger than that which flows through said second output terminal.

26. A detection circuit according to claim 1, wherein said signal supply means is a photosensor.

27. A detection circuit according to claim 1, wherein said signal supply means is a magnetic sensor.

28. A detection circuit according to claim 1, wherein said detection circuit is a one-chip IC.

29. An apparatus comprising:

means for supplying a signal including a light source for generating light which enters a photosensor; and a detection circuit, comprising:

a current mirror circuit having an input terminal connected to the signal supply means, and first and second output terminals through which electric currents corresponding to an electric current supplied to the input terminal flow;

a first active load connected to the first output terminal;

a second active load connected to the second output terminal and an external output terminal and having a control electrode; and a control circuit for controlling an electrical potential of the control electrode of the second active load on the basis of a voltage value or the current value at the first output terminal.

30. A laser printer comprising:

means for supplying a signal including a light source for generating light which enters a photosensor; and a detection circuit, comprising:

a current mirror circuit having an input terminal connected to the signal supply means, and first and second output terminals through which electric currents corresponding to an electric current supplied to the input terminal flow;

a first active load connected to the first output terminal;

a second active load connected to the second output terminal and an external output terminal and having a control electrode; and a control circuit for controlling an electrical potential of the control electrode of the second active load on the basis of a voltage value or the current value at the first output terminal.

31. An optical disk comprising:

means for supplying a signal including a light source for generating light which enters a photosensor; and a detection circuit, comprising:

a current mirror circuit having an input terminal connected to the signal supply means, and first and second output terminals through which electric currents corresponding to an electric current supplied to the input terminal flow;

a first active load connected to the first output terminal;

a second active load connected to the second output terminal and an external output terminal and having a control electrode; and a control circuit for controlling an electrical potential of the control electrode of the second active load on the basis of a voltage value or the current value at the first output terminal.

* * * * *

UNITED STATES PATENT AND TRADEMARK OFFICE
CERTIFICATE OF CORRECTION

PATENT NO. : 5,801,581
DATED : September 1, 1998
INVENTOR(S) : Toru Koizumi

It is certified that error appears in the above-identified patent and that said Letters Patent is hereby corrected as shown below:

On the title page,

AT [56] REFERENCES CITED

Insert:   --U.S. PATENT DOCUMENTS
                 4,740,687  4/1988  Kiyohara--.

COLUMN 10

Line 46, "said" should be deleted.

Signed and Sealed this

Twenty-fifth Day of May, 1999

Attest:

Q. TODD DICKINSON

Attesting Officer     Acting Commissioner of Patents and Trademarks